(12) United States Patent
Shimauchi et al.

(10) Patent No.: US 10,084,464 B1
(45) Date of Patent: Sep. 25, 2018

(54) AD CONVERTER, SEMICONDUCTOR INTEGRATED CIRCUIT, AND ROTATION DETECTOR

(71) Applicant: Mitsubishi Electric Corporation, Tokyo (JP)

(72) Inventors: Hideki Shimauchi, Tokyo (JP); Akio Kamimurai, Tokyo (JP); Takeharu Umegami, Tokyo (JP); Yoshinori Tatenuma, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/938,656

(22) Filed: Mar. 28, 2018

(30) Foreign Application Priority Data

Nov. 10, 2017 (JP) .................................. 2017-217092

(51) Int. Cl.
  *H03M 1/12* (2006.01)
  *H03M 1/06* (2006.01)
  *G01D 5/12* (2006.01)

(52) U.S. Cl.
  CPC ............ *H03M 1/0607* (2013.01); *G01D 5/12* (2013.01)

(58) Field of Classification Search
  CPC ..... H03M 1/0607; H03M 1/1009; G01D 5/12
  USPC ........................................ 341/155, 118, 120
  See application file for complete search history.

(56) References Cited

U.S. PATENT DOCUMENTS

| 9,397,679 B1 * | 7/2016 | Harpe ................. H03M 1/1033 |
| 9,780,802 B1 * | 10/2017 | Kim ................... H03M 1/1033 |
| 9,912,343 B1 * | 3/2018 | Li ........................ H03M 1/1009 |

FOREIGN PATENT DOCUMENTS

| JP | 02-271712 A | 11/1990 |
| JP | 05-029940 A | 2/1993 |
| JP | 09-036741 A | 2/1997 |
| JP | 09-074340 A | 3/1997 |
| JP | 10-028053 A | 1/1998 |
| JP | 10-190420 A | 7/1998 |
| JP | 2000-121678 A | 4/2000 |
| JP | 2002-319854 A | 10/2002 |
| JP | 2010-517336 A | 5/2010 |
| WO | 2008/086609 A1 | 7/2008 |

\* cited by examiner

*Primary Examiner* — Brian Young
(74) *Attorney, Agent, or Firm* — Sughrue Mion, PLLC; Richard C. Turner

(57) ABSTRACT

Provided is an AD converter having a rail-to-rail input voltage range and being free of a missing code and monotonicity loss. A comparator includes a first comparator having an NMOS differential input stage, a second comparator having a PMOS differential input stage, and an output selection circuit configured to select any one of outputs of the two comparators. A correction circuit acquires in advance a first AD converted value in the case of using the first comparator and a second AD converted value in the case of using the second comparator with respect to the same input voltage to calculate a correction value, and performs correction processing based on the correction value to suppress an offset error between the first AD converted value and the second AD converted value.

14 Claims, 7 Drawing Sheets

AD CONVERTER, SEMICONDUCTOR INTEGRATED CIRCUIT, AND ROTATION DETECTOR

BACKGROUND OF THE INVENTION

1. Field of the Invention

The present invention relates to an analog-to-digital (AD) converter (ADC) having a rail-to-rail input voltage range, a semiconductor integrated circuit, and a rotation detector.

2. Description of the Related Art

In an AD converter capable of converting a rail-to-rail input voltage, which ranges from a ground voltage to a power supply voltage, into a digital value, it is required to use a comparator having a rail-to-rail input voltage range as a comparator for comparing an input voltage and a reference voltage.

As the comparator having the rail-to-rail input voltage range, there has been proposed a related-art device having a circuit configuration formed by a combination of a comparator having an NMOS differential input stage and a comparator having a PMOS differential input stage (for example, see Japanese Patent Translation Publication No. 2010-517336).

The comparator having the NMOS differential input stage cannot perform normal comparison operation when the input voltage is about 1 V or less. Meanwhile, the comparator having the PMOS differential input stage cannot perform normal comparison operation when the input voltage is ((power supply voltage)−(about 1 V)) or more.

In view of this, the related-art device has a configuration to switch an output of the comparator to be used with respect to an input voltage between the comparator having the NMOS differential input stage and the comparator having the PMOS differential input stage. With such a configuration, the related-art device has achieved the normal comparison operation in the rail-to-rail input voltage range of from the ground voltage to the power supply voltage.

With use of such a related-art comparator for the AD converter, the AD converter having the rail-to-rail input voltage range can be formed.

Meanwhile, as a method of correcting a conversion error of the AD converter, for example, there has been known a method involving arranging a plurality of AD converters (for example, see Japanese Patent Application Laid-open No. Hei 10-028053).

However, the related art has problems as follows.

The comparator typically has an offset voltage caused by manufacturing variations. Therefore, a deviation corresponding to an offset voltage exists with respect to a comparison voltage.

There is a difference in offset voltage caused by manufacturing variations between the comparator having the NMOS differential input stage and the comparator having the PMOS differential input stage as described above. For this reason, even when the same voltage is input, there may be a difference in comparison result between the comparators, for example, the comparison result of the comparator having the NMOS differential input stage is a high level, while the comparison result of the comparator having the PMOS differential input stage is a low level.

When the comparison results are different between the comparator having the NMOS differential input stage and the comparator having the PMOS differential input stage, an offset error occurs in an AD conversion result when the comparator to be operated is switched. Hereinafter, the input voltage is represented by Vin, the offset voltage of the comparator having the NMOS differential input stage is represented by Voffset(n), and the offset voltage of the comparator having the PMOS differential input stage is represented by Voffset(p).

In this case, the AD conversion result in the case of using the comparator having the NMOS differential input stage is a result of performing the AD conversion on a voltage of Vin+Voffset(n). Meanwhile, the AD conversion result in the case of using the comparator having the PMOS differential input stage is a result of performing the AD conversion on a voltage of Vin+Voffset(p).

Therefore, this offset error may cause a problem, for example, occurrence of a missing code or monotonicity loss.

Further, as described in Japanese Patent Application Laid-open No. Hei 10-028053, there has been known a method involving arranging a plurality of AD converters in order to correct a conversion error. However, with this configuration of Japanese Patent Application Laid-open No. Hei 10-028053, a circuit size is undesirably large.

SUMMARY OF THE INVENTION

The present invention has been made in order to solve the problems described above, and it is an object of the present invention to obtain an AD converter, a semiconductor integrated circuit, and a rotation detector, which prevent an increase in circuit size and eliminate an offset error caused by switching between two comparators that are operated with a rail-to-rail input voltage range to be free of a missing code and monotonicity loss.

An AD converter according to one embodiment of the present invention includes: a comparator having an entire input voltage range of from a ground voltage to a power supply voltage; an analog-to-digital converter (ADC) control circuit; a correction circuit; and a storage device. The comparator includes: a first comparator having an NMOS differential input stage, which is capable of performing normal comparison operation within a range of from a first input voltage, which is higher than the ground voltage and lower than the power supply voltage, to the power supply voltage; a second comparator having a PMOS differential input stage, which is capable of performing normal comparison operation within a range of from the ground voltage to a second input voltage, which is higher than the first input voltage and lower than the power supply voltage; and an output selection circuit, which is configured to select any one of an output of the first comparator and an output of the second comparator depending on a magnitude of an input voltage. The correction circuit is configured to: acquire in advance, via the ADC control circuit, a first AD converted value in the case of using the first comparator and a second AD converted value in the case of using the second comparator with respect to a same input voltage in a common region corresponding to a region of an input voltage of the first input voltage or more and the second input voltage or less, in which both the first comparator and the second comparator are capable of performing the normal comparison operation; calculate a correction value based on the first AD converted value and the second AD converted value, which are obtained with respect to the same input voltage; store in advance the correction value into the storage device; perform correction processing based on the correction value to suppress an offset error between the first AD converted value and the second AD converted value; and output an AD converted value after suppression of the offset error in the entire input voltage range.

The present invention has a configuration in which, in the region in which the two comparators that are selectively switched are normally operable in common, outputs of the respective comparators with respect to the same input voltage are subjected to AD conversion, and an offset error is corrected based on the respective AD converted values. As a result, it is possible to obtain the AD converter, the semiconductor integrated circuit, and the rotation detector, which prevent the increase in circuit size and eliminate the offset error caused by switching between the two comparators that are operated with the rail-to-rail input voltage range to be free of the missing code and the monotonicity loss.

DESCRIPTION OF THE EMBODIMENTS

Referring to the accompanying drawings, an AD converter, a semiconductor integrated circuit, and a rotation detector according to exemplary embodiments of the present invention are described below.

First Embodiment

Figure 1:
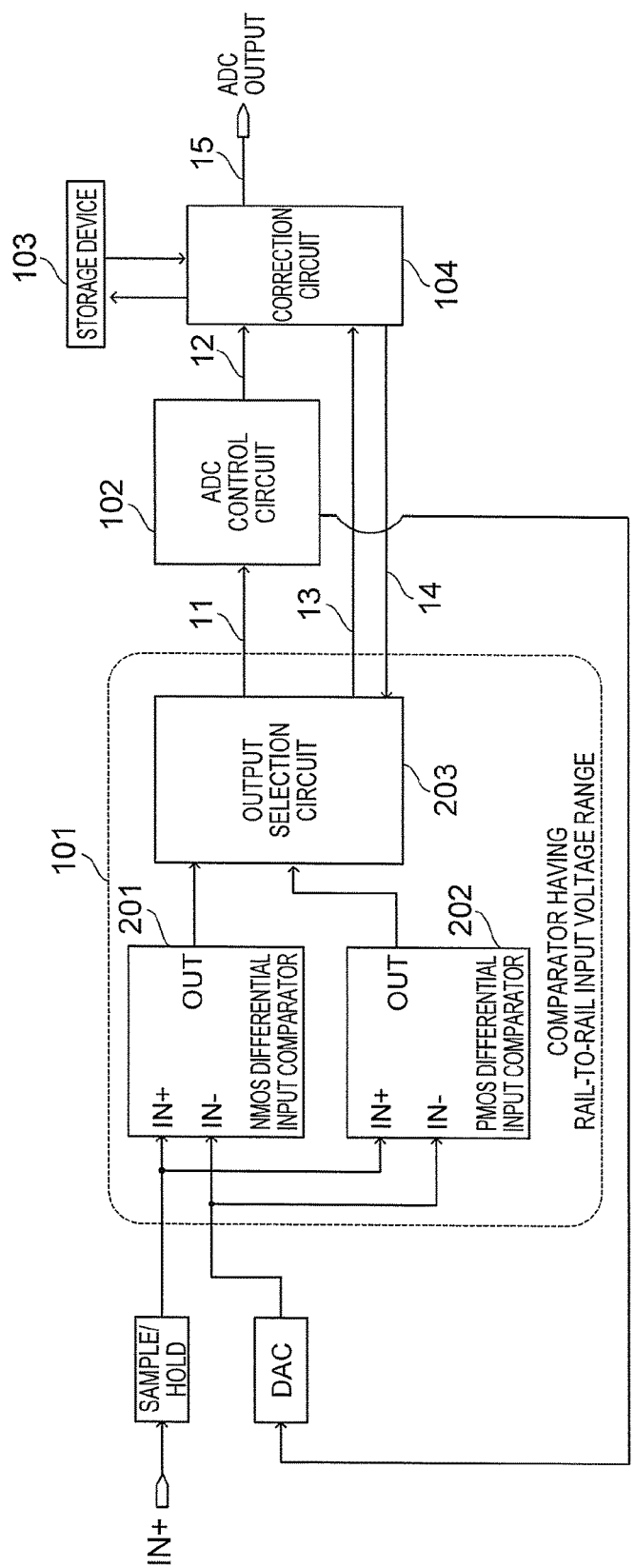
FIG. 1 is a configuration diagram of an AD converter according to a first embodiment of the present invention.

FIG. 1 is a configuration diagram of an AD converter according to a first embodiment of the present invention. The AD converter in FIG. 1 includes: a comparator 101 having a rail-to-rail input voltage range; a storage device 103, which is configured to store a correction value; and a correction circuit 104, which is configured to perform correction processing by using an AD converted value 12 that is output from an ADC control circuit 102 and a correction value stored in the storage device 103.

The comparator 101 includes a comparator 201 having an NMOS differential input stage, a comparator 202 having a PMOS differential input stage, and an output selection circuit 203 for selecting any one of an output of the comparator 201 and an output of the comparator 202.

Figure 2:
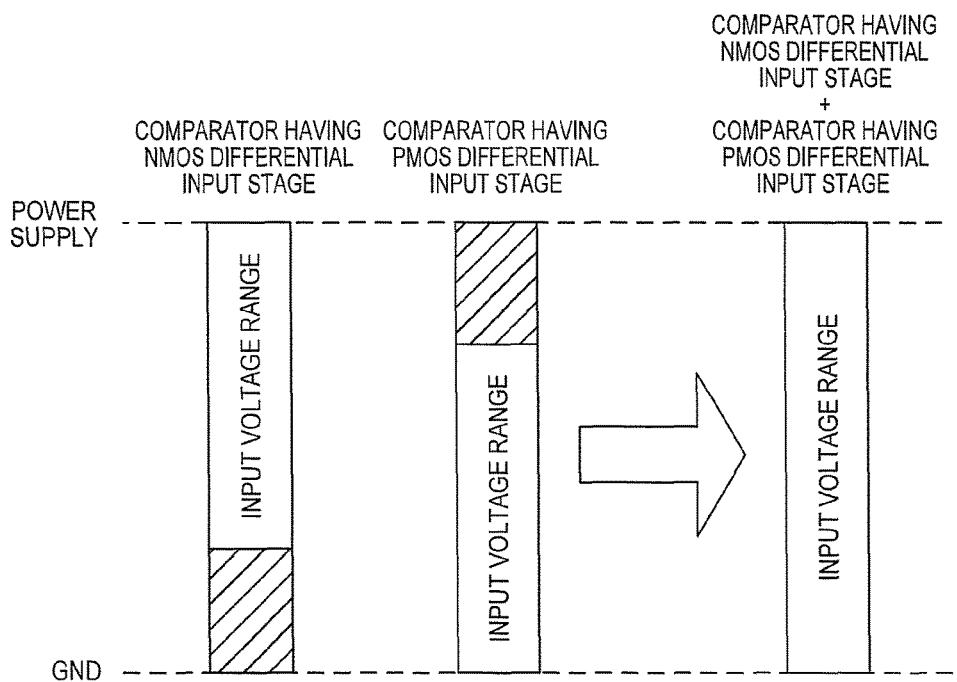
FIG. 2 is a diagram for illustrating an input voltage range of a comparator.

FIG. 2 is a diagram for illustrating an input voltage range of the comparator 101. In the comparator 101, which includes the circuit illustrated in FIG. 1, and has the rail-to-rail input voltage range, there is a region in which the comparator 201 having the NMOS differential input stage and the comparator 202 having the PMOS differential input stage are normally operable in common, as illustrated in FIG. 2.

Accordingly, the AD converter according to the first embodiment compares an operation result of the comparator 201 and an operation result of the comparator 202 with respect to the same input voltage in this region in which the two comparators are normally operable in common, to correct an offset error between both comparators.

Specifically, in the AD converter according to the first embodiment, both the comparator 201 having the NMOS differential input stage and the comparator 202 having the PMOS differential input stage perform AD conversion on the same input voltage in this region in which the two comparators are normally operable in common. The AD converter according to the first embodiment performs correction processing at the time of actually performing AD conversion based on a difference between the two AD converted values acquired in advance as thus described. As a result, the AD converter capable of correcting an offset error between AD converted values of both comparators can be achieved.

Figure 3:
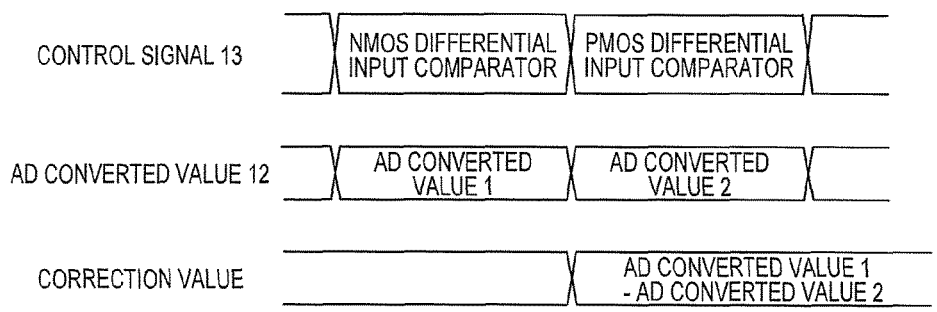
FIG. 3 is an explanatory diagram for illustrating a correction value acquiring method in a correction circuit in the first embodiment of the present invention.

The correction circuit 104 illustrated in FIG. 1 performs such correction of the offset error. A correction value acquiring method performed by the correction circuit 104 is described with reference to FIG. 3. FIG. 3 is an explanatory diagram for illustrating the correction value acquiring method in the correction circuit 104 in the first embodiment of the present invention.

The correction circuit 104 outputs a control signal 14 to control the output selection circuit 203, and performs switch-control as to whether the output of the comparator 201 having the NMOS differential input stage or the output of the comparator 202 having the PMOS differential input stage is to be taken as an output signal 11 from the output selection circuit 203 with respect to the same input voltage.

The output selection circuit 203 having received the control signal 14 outputs, along with the output signal 11, a control signal 13 for identifying whether the output of the comparator 201 is being made or the output of the comparator 202 is being made as the output signal 11. The ADC control circuit 102 outputs a result of performing the AD conversion on the output signal 11, as the AD converted value 12.

As a result, the correction circuit 104 can acquire the control signal 13 from the output selection circuit 203 and the AD converted value 12 from the ADC control circuit 102 as illustrated in FIG. 3, based on the control signal 14 output by the correction circuit 104 itself. That is, the correction circuit 104 can acquire an AD converted value 1 obtained by converting the same input voltage by use of the output of the comparator 201 having the NMOS differential input stage, and an AD converted value 2 obtained by converting the same input voltage by use of the output of the comparator 202 having the PMOS differential input stage.

Further, the correction circuit 104 calculates a difference between the AD conversion results, and stores the calculated value as a correction value into the storage device 103. The correction value, which is used when the correction processing is performed at the time of using the output of the comparator 202 having the PMOS differential input stage as the output signal 11 from the output selection circuit 203, is a value obtained by subtracting the AD converted value 2 from the AD converted value 1.

Meanwhile, the correction value, which is used when the correction processing is performed at the time of using the output of the comparator 201 having the NMOS differential input stage as the output signal 11 from the output selection circuit 203, is a value obtained by subtracting the AD converted value 1 from the AD converted value 2.

Figure 4:
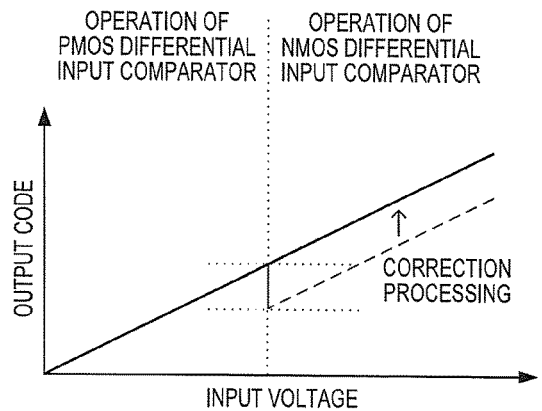
FIG. 4 is an explanatory graph for showing a correction method for an AD converted value, which is performed by the correction circuit in the first embodiment of the present invention.

FIG. 4 is an explanatory graph for showing a correction method for an AD converted value, which is performed by the correction circuit 104 in the first embodiment of the present invention. FIG. 4 is a graph for showing an example of the correction processing in the case of performing correction so as to cancel an offset error at the time of using the output of the comparator 201 having the NMOS differential input stage as the output signal 11 from the output selection circuit 203.

The correction circuit 104 determines whether the output of the comparator 201 having the NMOS differential input stage or the output of the comparator 202 having the PMOS differential input stage has been used by the ADC control circuit 102 to perform the AD conversion, based on the control signal 13 that is output from the output selection circuit 203.

When the correction circuit 104 receives as the AD converted value 12 a result of the AD conversion performed by use of the output of the comparator 201 having the NMOS differential input stage, the correction circuit 104 adds the correction value stored in the storage device 103 to the AD converted value 12 to perform correction so as to cancel an offset error.

As shown in FIG. 4, when such correction processing is performed, an offset error is not generated in an AD converted value after the correction by the correction circuit 104 even when the output signal 11 from the output selection circuit 203 is switched between the output of the comparator 201 having the NMOS differential input stage and the output of the comparator 202 having the PMOS differential input stage. Consequently, an AD converter free of a missing code and monotonicity loss can be achieved.

Further, the only circuits that are required to be added in order to correct the AD converted value are the correction circuit 104 and the storage device 103. Therefore, with the AD converter according to the first embodiment, the correction processing for canceling an offset error can be achieved at low cost by adding small-sized circuits.

Second Embodiment

Figure 5:
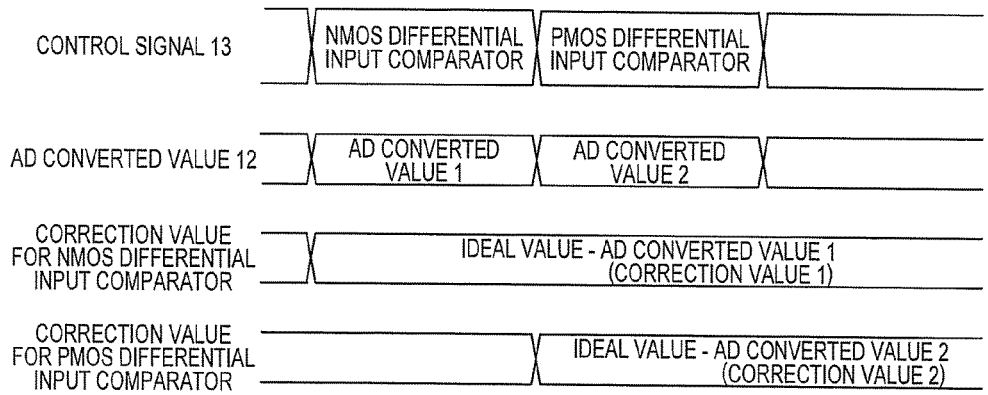
FIG. 5 is an explanatory diagram for illustrating a correction value acquiring method in a correction circuit in a second embodiment of the present invention.

FIG. 5 is an explanatory diagram for illustrating a correction value acquiring method in a correction circuit 104 in a second embodiment of the present invention. A feature of the second embodiment resides in performing the correction processing by a correction method illustrated in FIG. 5 in the AD converter of FIG. 1.

At the time of performing the correction method illustrated in FIG. 5, in the same manner as in the above-mentioned first embodiment, the correction circuit 104 can acquire the control signal 13 from the output selection circuit 203 and the AD converted value 12 from the ADC control circuit 102 as illustrated in FIG. 5, based on the control signal 14 output by the correction circuit 104 itself. That is, the correction circuit 104 can acquire an AD converted value 1 obtained by converting the same input voltage by use of the output of the comparator 201 having the NMOS differential input stage and an AD converted value 2 obtained by converting the same input voltage by use of the output of the comparator 202 having the PMOS differential input stage.

The correction circuit 104 in the second embodiment holds in advance an ideal AD converted value with respect to the same input voltage. Therefore, the correction circuit 104 calculates as a correction value 1 a difference between the ideal value and the AD converted value 1 converted by use of the output of the comparator 201 having the NMOS differential input stage, and calculates as a correction value 2 a difference between the ideal value and the AD converted value 2 converted by use of the output of the comparator 202 having the PMOS differential input stage. The correction circuit 104 can cause the storage device 103 to store in advance the calculated correction values.

Figure 6:
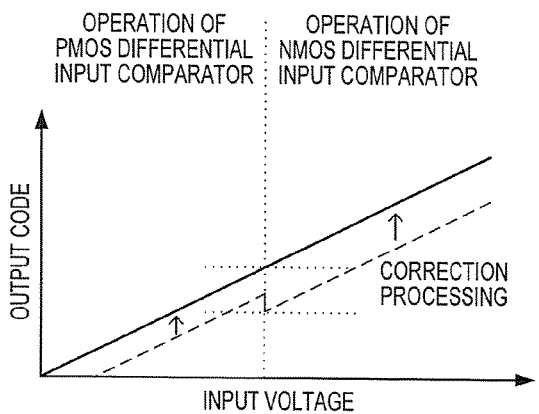
FIG. 6 is an explanatory graph for showing a correction method for an AD conversion result, which is performed by the correction circuit in the second embodiment of the present invention.

FIG. 6 is an explanatory graph for showing a correction method for an AD conversion result, which is performed by the correction circuit 104 in the second embodiment of the present invention. The correction circuit 104 determines whether the AD converted value 12 is an AD converted value obtained by use of the output of the comparator 201 having the NMOS differential input stage or an AD converted value obtained by use of the output of the comparator 202 having the PMOS differential input stage, based on the control signal 13 that is output from the output selection circuit 203.

When the correction circuit 104 determines to have acquired the AD converted value 12 obtained by use of the output of the comparator 201 having the NMOS differential input stage, the correction circuit 104 adds the correction value 1 stored in the storage device 103 to the AD converted value 12 to perform correction so as to cancel an offset error.

Meanwhile, when the correction circuit 104 determines to have acquired the AD converted value 12 obtained by use of the output of the comparator 202 having the PMOS differential input stage, the correction circuit 104 adds the correction value 2 stored in the storage device 103 to the AD converted value 12 to perform correction so as to cancel an offset error.

As described above, when correction is performed on the ideal AD converted value with respect to the same input voltage, an offset error is not generated in an AD converted value after the correction by the correction circuit 104 even when the output signal 11 from the output selection circuit 203 is switched between the output of the comparator 201 having the NMOS differential input stage and the output of the comparator 202 having the PMOS differential input stage, as shown in FIG. 6. Further, through the correction processing in the second embodiment, an absolute value of the AD converted value can be corrected as shown in FIG. 6.

Third Embodiment

Figure 7:
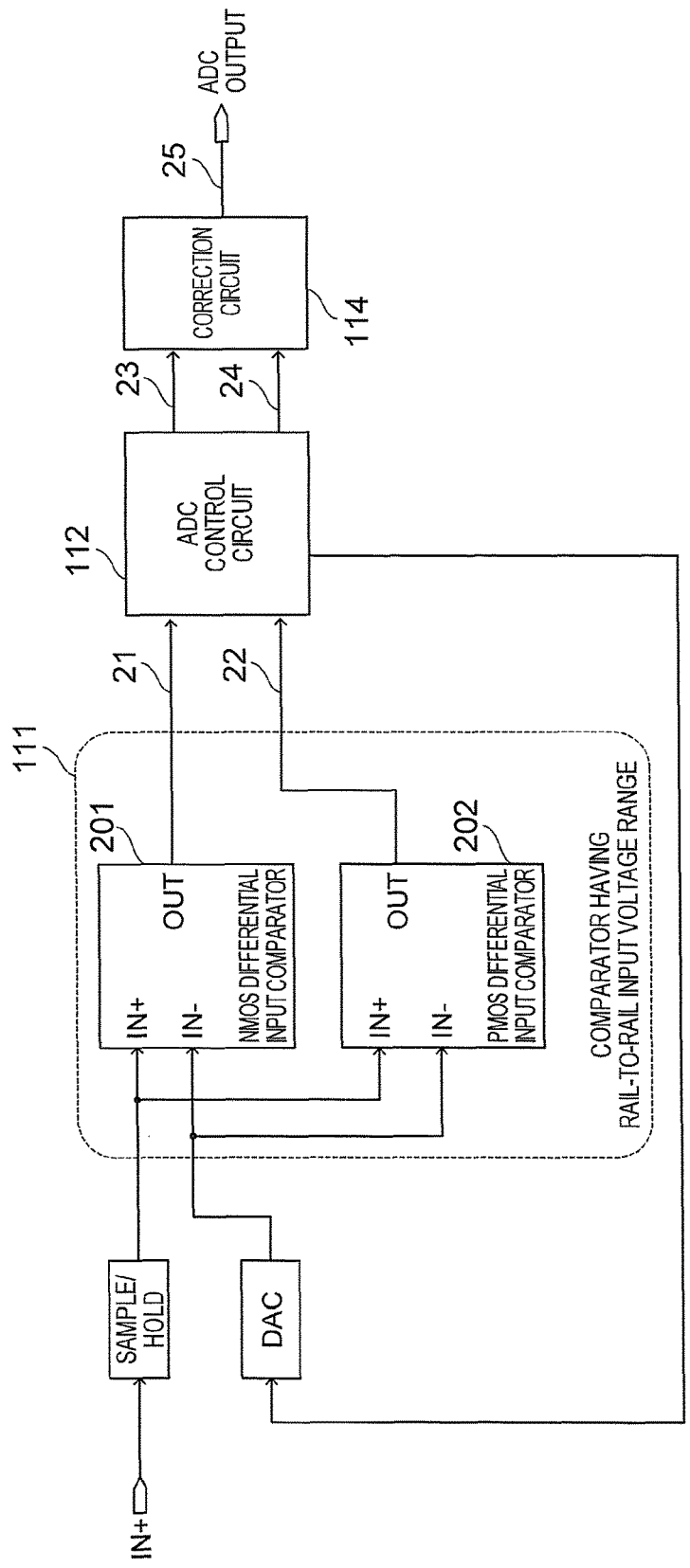
FIG. 7 is a configuration diagram of an AD converter according to a third embodiment of the present invention.

FIG. 7 is a configuration diagram of an AD converter according to a third embodiment of the present invention. The AD converter in FIG. 7 includes: a comparator 111 having a rail-to-rail input voltage range; an ADC control circuit 112; and a correction circuit 114.

The comparator 111 includes a comparator 201 having an NMOS differential input stage and a comparator 202 having a PMOS differential input stage. Further, an output 21 of the comparator 201 having the NMOS differential input stage and an output 22 of the comparator 202 having the PMOS differential input stage are both output to the ADC control circuit 112.

The ADC control circuit 112 outputs, to the correction circuit 114, both an AD converted value 23 obtained based on the output 21 of the comparator 201 having the NMOS differential input stage and an AD converted value 24 obtained based on the output 22 of the comparator 202 having the PMOS differential input stage.

The correction circuit 114 performs averaging processing by weighting the AD converted value 23 obtained based on the output 21 of the comparator 201 having the NMOS differential input stage and the AD converted value 24 obtained based on the output 22 of the comparator 202 having the PMOS differential input stage within a prescribed voltage range, thereby performing correction so as to cancel an offset error.

Figure 8:
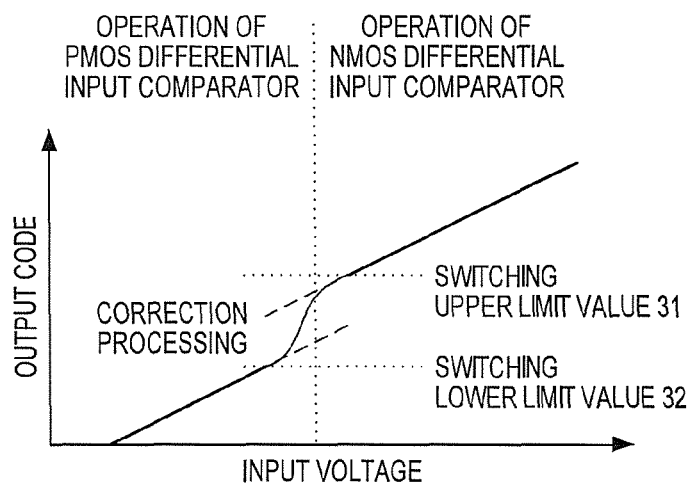
FIG. 8 is an explanatory graph for showing a correction method for AD converted values, which is performed by a correction circuit in the third embodiment of the present invention.

FIG. 8 is an explanatory graph for showing a correction method for AD converted values, which is performed by the correction circuit 114 in the third embodiment of the present invention. As shown in FIG. 8, the correction circuit 114 holds a switching upper limit value 31 and a switching lower limit value 32 as values defining a voltage range in which weighted averaging is performed.

When both the AD converted value 23 and the AD converted value 24 are within the range between the switching upper limit value 31 and the switching lower limit value 32, the correction circuit 114 performs weighted averaging processing on the AD converted value 23 and the AD converted value 24, and outputs the obtained value as an AD converted value 25.

As compared with the AD converter illustrated in FIG. 1, the AD converter illustrated in FIG. 7 does not require the output selection circuit 203 and the storage device 103. Accordingly, in the third embodiment, it is possible to achieve an AD converter having a small circuit size as compared with those of the above-mentioned first and second embodiments.

Fourth Embodiment

Figure 9:
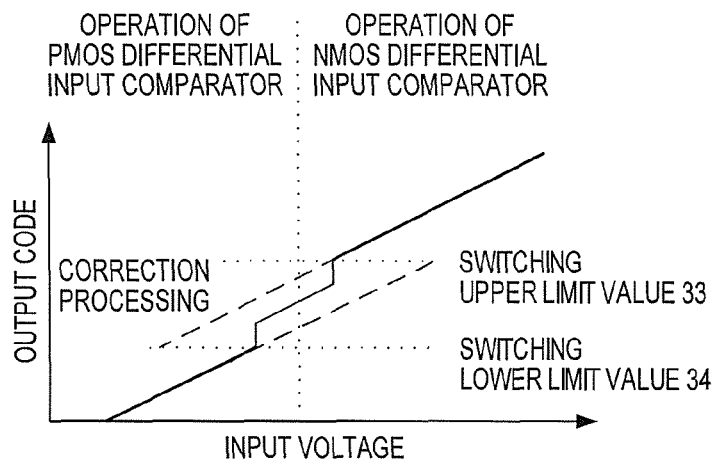
FIG. 9 is an explanatory graph for showing a correction method for an AD converted value, which is performed by a correction circuit in a fourth embodiment of the present invention.

FIG. 9 is an explanatory graph for showing a correction method for AD converted values, which is performed by a correction circuit 114 according to a fourth embodiment of the present invention. A feature of the fourth embodiment resides in performing the correction processing by the correction method shown in FIG. 9 in the AD converter of FIG. 7.

In the correction method shown in FIG. 9, the correction circuit 114 performs simple averaging on the AD converted value 23 and the AD converted value 24 within a prescribed voltage range, thereby performing correction so as to cancel an offset error.

As shown in FIG. 9, the correction circuit 114 holds a switching upper limit value 33 and a switching lower limit value 34 as values defining a voltage range in which the simple averaging is performed. When both the AD converted value 23 and the AD converted value 24 are within the range between the switching upper limit value 33 and the switching lower limit value 34, the correction circuit 114 performs simple averaging processing on the AD converted value 23 and the AD converted value 24, and outputs the obtained value as the AD converted value 25.

In the fourth embodiment, the correction processing on the AD converted values is simple as compared with that in the above-mentioned third embodiment. Thus, according to the fourth embodiment, it is possible to achieve an AD converter having a further small circuit size as compared with the circuit size in the above-mentioned third embodiment. However, in the correction processing according to the fourth embodiment, the offset error is reduced, but not completely eliminated. Thus, when an original offset is small, the missing code and the monotonicity loss can be improved by using the correction processing according to the fourth embodiment.

Fifth Embodiment

Figure 10:
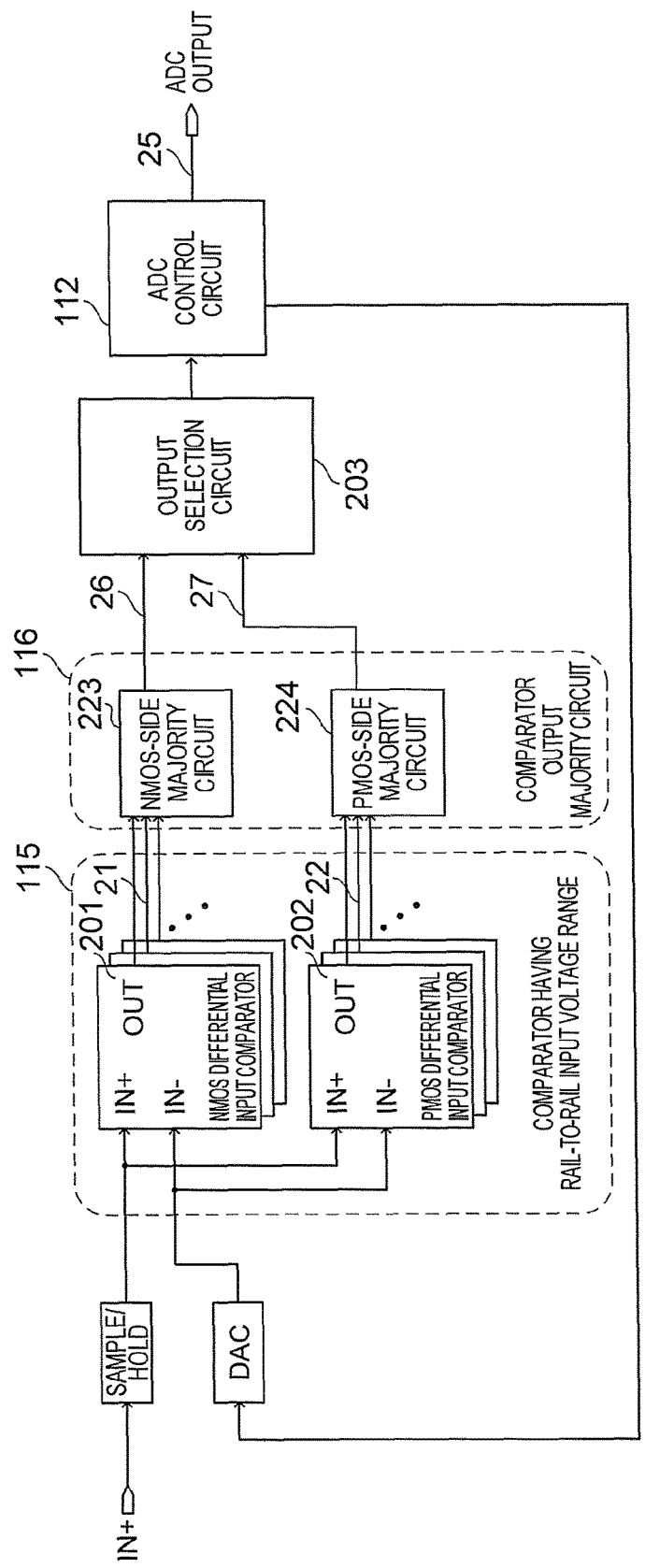
FIG. 10 is a configuration diagram of an AD converter according to a fifth embodiment of the present invention.

FIG. 10 is a configuration diagram of an AD converter according to a fifth embodiment of the present invention. The AD converter in FIG. 10 includes: a comparator 115, which includes a plurality of comparators 201 having NMOS differential input stages and a plurality of comparators 202 having PMOS differential input stages, and has a rail-to-rail input voltage range; a majority circuit 116, which is configured to select one output from the plurality of comparators; the output selection circuit 203; and the ADC control circuit 112.

The majority circuit 116 includes an NMOS-side majority circuit 223 and a PMOS-side majority circuit 224. Outputs 21 of the plurality of comparators 201 having the NMOS differential input stages are connected to the NMOS-side majority circuit 223, and the NMOS-side majority circuit 223 generates a result 26 of making a majority decision out of the outputs 21 of the plurality of comparators 201.

Similarly, outputs 22 of the plurality of comparators 202 having the PMOS differential input stages are connected to the PMOS-side majority circuit 224, and the PMOS-side majority circuit 224 generates a result 27 of making a majority decision out of the outputs 22 of the plurality of comparators 202.

In accordance with the input voltage, the output selection circuit 203 outputs, to the ADC control circuit 112, any one of the result 26 of the NMOS-side majority circuit 222 and the result 27 of the PMOS-side majority circuit 223.

The AD converter according to the fifth embodiment can average offsets of the plurality of outputs 21 and offsets of the plurality of outputs 22 by making a majority decision out of the plurality of outputs 21 of the plurality of comparators 201 and a majority decision out of the plurality of outputs 22 of the plurality of comparators 202.

That is, the AD converter according to the fifth embodiment uses the majority circuit to perform the averaging processing on an offset instead of using the correction circuit to perform the correction processing, thereby enabling reduction in offset caused by variations in manufacturing of the comparators. As a result, the AD converter according to the fifth embodiment having no correction circuit can also correct an offset error of an AD converted value.

Sixth Embodiment

A feature of a sixth embodiment of the present invention resides in that, in each of the plurality of comparators 201 having the NMOS differential input stages and each of the plurality of comparators 202 having the PMOS differential input stages described in the fifth embodiment, transistors included in the comparators have different sizes.

An offset voltage caused by variations in manufacturing of the comparators also depends on the sizes of the transistors included in the comparators. Thus, when comparators with different transistor sizes are mounted, deviations of offsets of the comparators can be reduced. The AD converter according to the sixth embodiment can average offsets with higher accuracy as compared with the above-mentioned fifth embodiment by making a majority decision out of outputs of a plurality of comparators with reduced deviations of offsets.

Seventh Embodiment

Figure 11:
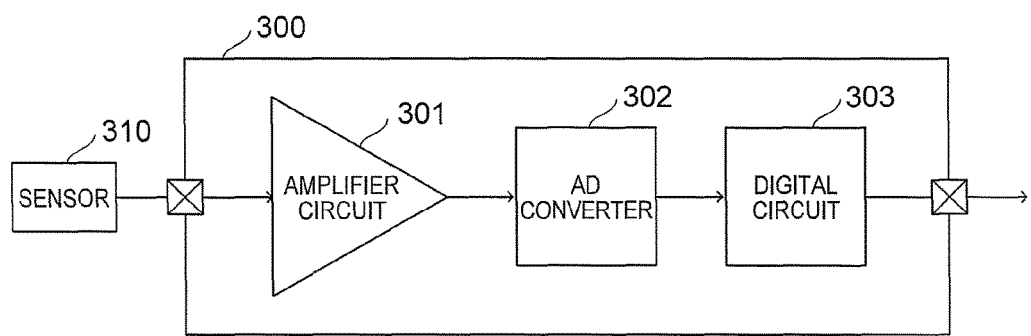
FIG. 11 is a configuration diagram for illustrating a semiconductor integrated circuit according to a seventh embodiment of the present invention.

FIG. 11 is a configuration diagram for illustrating a semiconductor integrated circuit 300 according to a seventh embodiment of the present invention. The semiconductor integrated circuit 300 illustrated in FIG. 11 includes: an amplifier circuit 301, which is configured to amplify a sensor signal to be input from a sensor 310; an AD converter 302, which is configured to convert an output of the amplifier circuit 301 into a digital signal; and a digital circuit 303, which is configured to perform signal processing on an output of the AD converter 302.

A sensor signal is typically a weak signal. Therefore, the amplitude of the sensor signal is required to be amplified by the amplifier circuit 301. The AD converter according to the present invention can be used as an AD converter for converting the output of the amplifier circuit 301 into the digital signal. By applying the AD converter according to the present invention, the AD conversion can be performed even when the sensor signal is amplified to a power supply voltage by the amplifier circuit 301. It is thereby possible to adopt an amplifier circuit with a higher degree of amplification. Accordingly, the semiconductor integrated circuit 300 according to the seventh embodiment can process the sensor signal with higher accuracy.

In this manner, it is possible to apply any one of the AD converters according to the above-mentioned first to sixth embodiments as an AD converter included in a known semiconductor integrated circuit.

Eighth Embodiment

In an eighth embodiment of the present invention, a description is given of a case in which the semiconductor integrated circuit 300 according to the above-mentioned seventh embodiment is applied as a semiconductor integrated circuit included in a known rotation detector.

Figure 12:
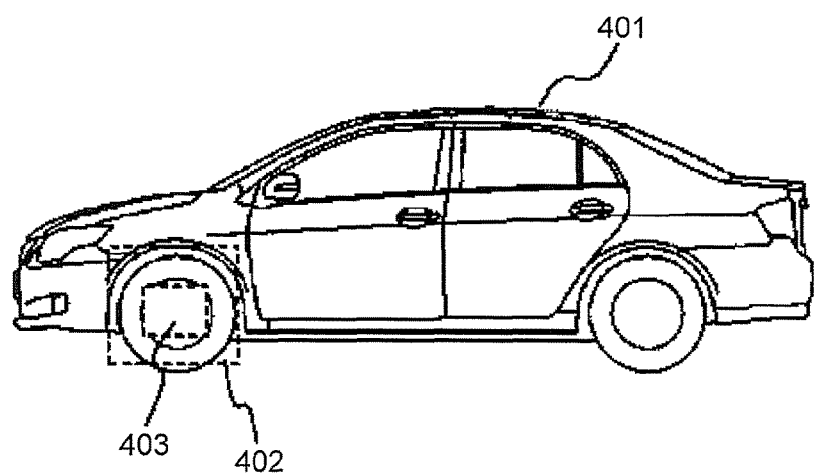
FIG. 12 is a configuration view for illustrating a vehicle in an eighth embodiment of the present invention.

FIG. 12 is a configuration view for illustrating a vehicle 401 in the eighth embodiment of the present invention. The vehicle 401 illustrated in FIG. 12 includes wheels 402 and a rotation detector 403 including the semiconductor integrated circuit 300. The rotation detector 403 is configured to detect a rotary axis of a rotary machine mounted in the vehicle 401, for example, a rotary axis of the wheels 402.

A variety of in-vehicle detectors, for example, the rotation detector 403, are required to be operated with high accuracy and low power consumption based on a demand for low fuel consumption. Such a requirement is satisfied by using the semiconductor integrated circuit 300 described in the above-mentioned seventh embodiment as the semiconductor integrated circuit included in the variety of detectors.

In this manner, it is possible to apply the semiconductor integrated circuit 300 including any one of the AD converters according to the above-mentioned first to sixth embodiments as a semiconductor integrated circuit included in a known rotation detector.

As described above, the eighth embodiment is configured to apply the semiconductor integrated circuit including any one of the AD converters according to the above-mentioned first to sixth embodiments as the semiconductor integrated circuit included in the known rotation detector. Therefore, it is possible to achieve a rotation detector including an AD converter free of the occurrence of the missing code and the monotonicity loss with the rail-to-rail input voltage range.

The first to eighth embodiments have been described as examples of the present invention, but the present invention is not limited to the configurations of the first to eighth embodiments. Within the scope not deviating from the gist of the present invention, the configurations of the first to eighth embodiments can be combined as appropriate, or can be modified partially or omitted partially.

What is claimed is:

1. An AD converter, comprising:
   a comparator having an entire input voltage range of from a ground voltage to a power supply voltage;
   an analog-to-digital converter (ADC) control circuit;
   a correction circuit; and
   a storage device,
   the comparator including:
      a first comparator having an NMOS differential input stage, which is capable of performing normal comparison operation within a range of from a first input voltage, which is higher than the ground voltage and lower than the power supply voltage, to the power supply voltage;
      a second comparator having a PMOS differential input stage, which is capable of performing normal comparison operation within a range of from the ground voltage to a second input voltage, which is higher than the first input voltage and lower than the power supply voltage; and
      an output selection circuit, which is configured to select any one of an output of the first comparator and an output of the second comparator depending on a magnitude of an input voltage, and
   wherein the correction circuit is configured to:
      acquire in advance, via the ADC control circuit, a first AD converted value in a case of using the first comparator and a second AD converted value in a case of using the second comparator with respect to a same input voltage in a common region corresponding to a region of an input voltage of the first input voltage or more and the second input voltage or less, in which both the first comparator and the second comparator are capable of performing the normal comparison operation;
      calculate a correction value based on the first AD converted value and the second AD converted value, which are obtained with respect to the same input voltage;
      store in advance the correction value into the storage device;
      perform correction processing based on the correction value to suppress an offset error between the first AD converted value and the second AD converted value; and
      output an AD converted value after suppression of the offset error in the entire input voltage range.

2. The AD converter according to claim 1, wherein the correction circuit is configured to:
   calculate in advance a difference between the first AD converted value and the second AD converted value as the correction value; and perform correction processing of one of addition and subtraction of the correction value, thereby to suppress the offset error between the first AD converted value and the second AD converted value.

3. The AD converter according to claim 1, wherein the correction circuit is configured to:
hold in advance, as an ideal value, an ideal AD converted value with respect to the same input voltage;
calculate in advance a difference between the first AD converted value and the ideal value as a first correction value;
calculate in advance a difference between the second AD converted value and the ideal value as a second correction value; and
perform correction processing of adding the first correction value to the first AD converted value and correction processing of adding the second correction value to the second AD converted value to suppress the offset error between the first AD converted value and the second AD converted value.

4. An AD converter, comprising:
a comparator having an entire input voltage range of from a ground voltage to a power supply voltage;
an ADC control circuit; and
a correction circuit,
the comparator including:
at least one first comparator having an NMOS differential input stage, which is capable of performing normal comparison operation within a range of from a first input voltage, which is higher than the ground voltage and lower than the power supply voltage, to the power supply voltage; and
at least one second comparator having a PMOS differential input stage, which is capable of performing normal comparison operation within a range of from the ground voltage to a second input voltage, which is higher than the first input voltage and lower than the power supply voltage,
wherein the ADC control circuit is configured to generate a first AD converted value based on an output of the at least one first comparator and a second AD converted value based on an output of the at least one second comparator, and
wherein the correction circuit is configured to:
perform averaging correction processing by using the first AD converted value and the second AD converted value in a common region corresponding to a region of an input voltage of the first input voltage or more and the second input voltage or less, in which both the at least one first comparator and the at least one second comparator are capable of performing the normal comparison operation to suppress an offset error between the first AD converted value and the second AD converted value; and
output an AD converted value after the suppression of the offset error in the entire input voltage range.

5. The AD converter according to claim 4,
wherein the correction circuit has an upper limit value and a lower limit value of an AD converted value for defining a range in which the averaging correction processing is performed, the upper limit value and the lower limit value being set in advance, and
wherein the correction circuit is configured to perform weighted averaging processing on the first AD converted value and the second AD converted value as the averaging correction processing with respect to an input voltage for which both the first AD converted value and the second AD converted value are within a range of the lower limit value or more and the upper limit value or less, to thereby suppress the offset error between the first AD converted value and the second AD converted value.

6. The AD converter according to claim 4,
wherein the correction circuit has an upper limit value and a lower limit value of an AD converted value for defining a range in which the averaging correction processing is performed, the upper limit value and the lower limit value being set in advance, and
wherein the correction circuit is configured to perform simple averaging processing on the first AD converted value and the second AD converted value as the averaging correction processing with respect to an input voltage for which both the first AD converted value and the second AD converted value are within a range of the lower limit value or more and the upper limit value or less, to thereby suppress the offset error between the first AD converted value and the second AD converted value.

7. An AD converter, comprising:
a plurality of comparators each having an entire input voltage range of from a ground voltage to a power supply voltage;
a majority circuit, which is configured to select one output out of outputs of the plurality of converters;
an output selection circuit; and
an ADC control circuit,
the plurality of comparators including:
a plurality of first comparators having NMOS differential input stages, which are capable of performing normal comparison operation within a range of from a first input voltage, which is higher than the ground voltage and lower than the power supply voltage, to the power supply voltage; and
a plurality of second comparators having PMOS differential input stages, which are capable of performing normal comparison operation within a range of from the ground voltage to a second input voltage, which is higher than the first input voltage and lower than the power supply voltage,
the majority circuit including:
a first majority circuit, which is configured to output a majority result made out of respective outputs from the plurality of first comparators; and
a second majority circuit, which is configured to output a majority result made out of respective outputs from the plurality of second comparators,
wherein the output selection circuit is configured to select and output any one of an output of the first majority circuit and an output of the second majority circuit,
wherein the ADC control circuit is configured to output an AD converted value with respect to the output selected in the output selection circuit, and
wherein an offset error of the AD converted value, which is caused by using any one of the plurality of comparators, is suppressed.

8. The AD converter according to claim 7,
wherein the plurality of first comparators include comparators having different transistor sizes, and
wherein the plurality of second comparators include comparators having different transistor sizes.

9. A semiconductor integrated circuit, comprising the AD converter of claim 1.

10. A semiconductor integrated circuit, comprising the AD converter of claim 4.

11. A semiconductor integrated circuit, comprising the AD converter of claim 7.

12. A rotation detector, comprising the semiconductor integrated circuit of claim 9.

13. A rotation detector, comprising the semiconductor integrated circuit of claim 10.

14. A rotation detector, comprising the semiconductor integrated circuit of claim 11.

* * * * *